United States Patent
Kim

[19]

[11] Patent Number: 5,960,298
[45] Date of Patent: Sep. 28, 1999

[54] METHOD OF FABRICATING SEMICONDUCTOR DEVICE HAVING TRENCH ISOLATION STRUCTURE

[75] Inventor: Young-Gwan Kim, Cheongju-Si, Rep. of Korea

[73] Assignee: LG Semicon Co., Ltd., Chungcheongbuk-Do, Rep. of Korea

[21] Appl. No.: 08/893,584

[22] Filed: Jul. 11, 1997

[30] Foreign Application Priority Data

Dec. 19, 1996 [KR] Rep. of Korea ............ 96-72491

[51] Int. Cl.[6] .................................................. H01L 21/76
[52] U.S. Cl. ................. 438/424; 438/430; 438/431; 438/298; 148/DIG. 50
[58] Field of Search ........................... 438/298, 424, 438/430, 426, 431; 148/DIG. 50

[56] References Cited

U.S. PATENT DOCUMENTS

| | | |
|---|---|---|
| 4,389,294 | 6/1983 | Anantha et al. .................. 438/978 |
| 5,387,540 | 2/1995 | Poon et al. . |
| 5,406,111 | 4/1995 | Sun .................................. 438/430 |
| 5,506,168 | 4/1996 | Morita et al. ..................... 438/424 |
| 5,604,159 | 2/1997 | Cooper et al. .................... 438/430 |
| 5,677,233 | 10/1997 | Abiko ........................ 148/DIG. 50 |

*Primary Examiner*—Trung Dang

[57] ABSTRACT

A method of fabricating a semiconductor device having a trench isolation structure includes forming an isolation region including a trench and a trench plug for filling the trench so as to define active regions on a substrate, a part of the trench plug projecting upward from the surface of the substrate, forming sidewall spacers from an oxidative material on the sidewalls of the projecting portion of the trench plug, and oxidating the surface of the active region of the substrate and the sidewall spacers so as to form a gate insulating layer extending to the upper part of the active region of the substrate and the side surfaces of the trench plug.

17 Claims, 6 Drawing Sheets

METHOD OF FABRICATING SEMICONDUCTOR DEVICE HAVING TRENCH ISOLATION STRUCTURE

BACKGROUND OF THE INVENTION

1. Field of the Invention

The present invention relates to a method of fabricating a semiconductor device having a trench isolation structure and, more particularly, to a method of fabricating a semiconductor device which is designed to enhance the reliability of a gate insulating layer.

2. Discussion of Related Art

It has been substantially required to reduce the size of a device isolation region as a design rule gets decreased with very large scale integration of a semiconductor device. For that reason, LOCOS (Local Oxidation of Silicon) method is substituted by a trench isolation structure which is designed to be suitable for a small interval. The trench isolation structure is useful in reducing the size of the device isolation region because it is easy to regulate its lateral distance.

The semiconductor device having such a trench isolation structure, however, involves a problem in that it results in the depreciation of the gate insulating layer's reliability. Because the gate insulating layer is not formed well in the cross-sectional corners of the trench with the oxidation, a breakdown may occur at low voltage because of an electric field concentration in the corners of the trench when the semiconductor device is in operation.

As a solution for this problem with the trench isolation structure, a method of forming a double-layered gate insulating layer is suggested in U.S. Pat. No. 5,387,540, which is illustrated in the cross-sectional views of FIGS. 1 and 2.

In a conventional method as illustrated in FIG. 1 and FIG. 2, a first insulating layer 141 is formed on the surface of an active region 13 of a substrate 11 defined by an isolation region 12 by oxidation as shown in FIG. 1. In FIG. 2, a second insulating layer 142 is formed with CVD (Chemical Vapor Deposition), covering the corner of a trench which is not completely covered by the first insulating layer 141. With this, a gate insulating layer 14 is finally completed comprising the first and second insulating layers 141 and 142.

The isolation region 12 includes the trench, a trench liner 122 for reducing etching damage during the formation of the trench, a trench plug 123, and a channel stop region 124. The reference numeral 15 of FIG. 2 depicts a gate electrode.

The second insulating layer 142 is deposited on the first insulating layer 141 with CVD so as to cover the corner of the trench in the prior art so that it is more difficult to regulate its thickness and has a lower reliability, compared with an insulating layer formed by oxidation. Moreover, as the gate insulating layer in a very largely integrated device of 1 Giga DRAM is less than 70 Å in thickness, it is hard to regulate the thickness of the gate insulating layer 14 by depositing the second insulating layer 142 on the first insulating layer 141 with CVD.

SUMMARY OF THE INVENTION

Accordingly, an object of the present invention is to provide a method of fabricating a semiconductor device having a gate insulating layer for insulating the corners of a trench and simultaneously having one layer on a device active region.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of fabricating a semiconductor device having a trench isolation structure includes a step of forming an isolation region, including a trench and a trench plug for filling the trench, so as to define an active region on a substrate. A part of the trench plug is projected upwards from the surface of the substrate. The method also includes forming sidewall spacers of an oxidative material on the side surfaces of the projected portion of the trench plug on the surface of the substrate, and carrying out an oxidation on the surface of the active region of the substrate and the sidewall spacers so as to form a gate insulating layer extending to the upper part of the active region of the substrate and the side surfaces of the trench plug.

The method of fabricating a semiconductor device having a trench isolation structure according to another embodiment of the present invention comprises the steps of forming an isolation region, including a trench and a trench plug for filling the trench, so as to define an active region on a substrate, a part of the trench plug being projected upwards on the surface of the substrate, forming sidewall spacers of a first insulating layer on the side surfaces of the projected portion of the trench plug on the surface of the substrate, and forming a second insulating layer comprising a gate insulating layer with the sidewall spacers of the first insulating layer on the active region of the substrate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and including the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

FIGS. 3A through 3J are flow diagrams illustrating a method of a semiconductor device having a trench isolation structure according to a preferred embodiment of manufacturing the present invention.

Figure 1:
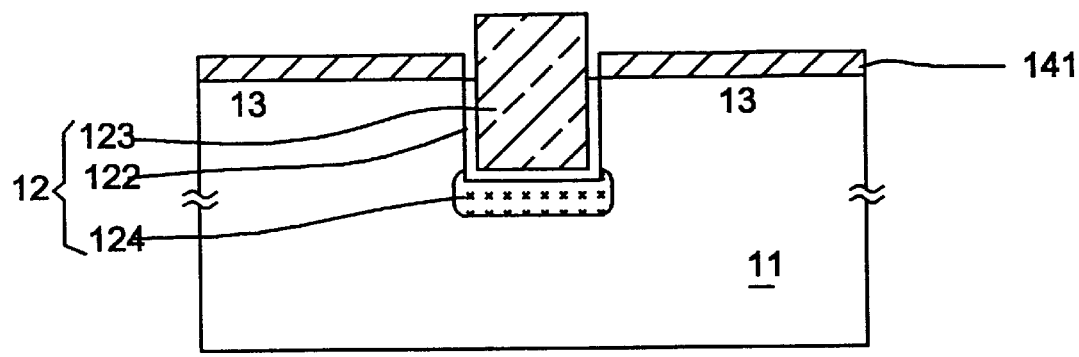
FIGS. 1 and 2 are cross-sectional views illustrating the method of fabricating a semiconductor device according to an example of the prior art.
Figure 2:
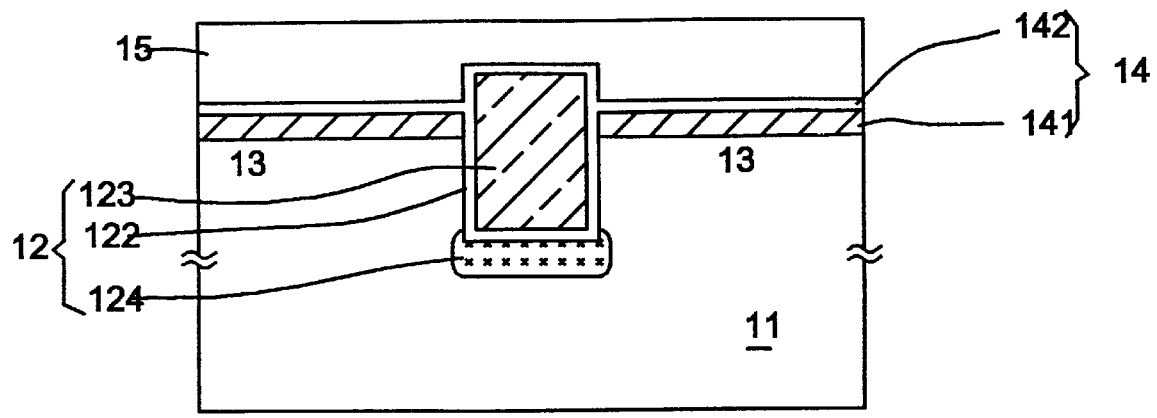
Figure 3A:
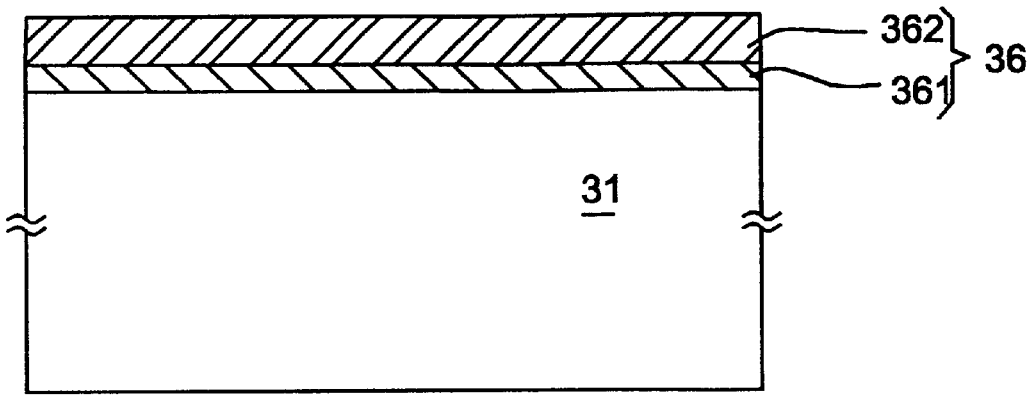
FIGS. 3A through 3J are flow diagrams illustrating a method of a semiconductor device having a trench isolation structure according to a preferred embodiment of the present invention.

Referring to FIG. 3A, an etch-stop layer 36 is formed on a semiconductor substrate 31. Silicon is used for the substrate 31. The etch-stop layer 36 comprises a buffer film 361 which is a silicon oxide layer, and a silicon nitride layer 362 formed on the buffer film 361. For the buffer film 361, the silicon oxide layer is formed with CVD (Chemical Vapor Deposition), more preferably, with thermal oxidation.

Figure 3B:
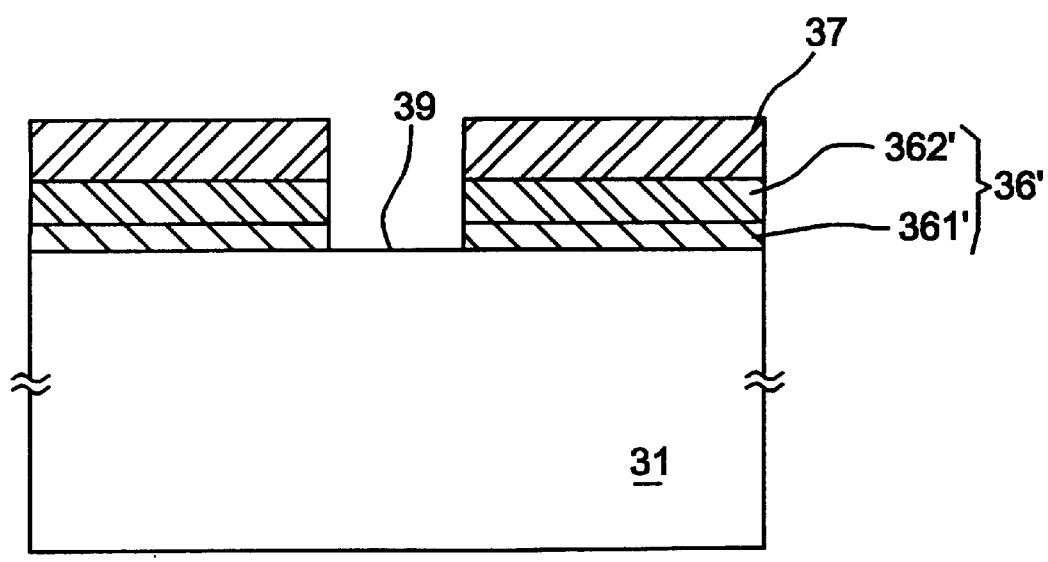

As shown in FIG. 3B, a photoresist mask 37 is formed on the etch-stop layer 36, and then a part of the etch-stop layer is removed so as to expose a first portion 39 of the substrate 31. The reference numeral 36' in the FIG. 3B depicts a patterned etch-stop layer. In addition, the reference numerals 361' and 362' depict a patterned buffer film and a patterned silicon nitride, respectively.

Figure 3C:
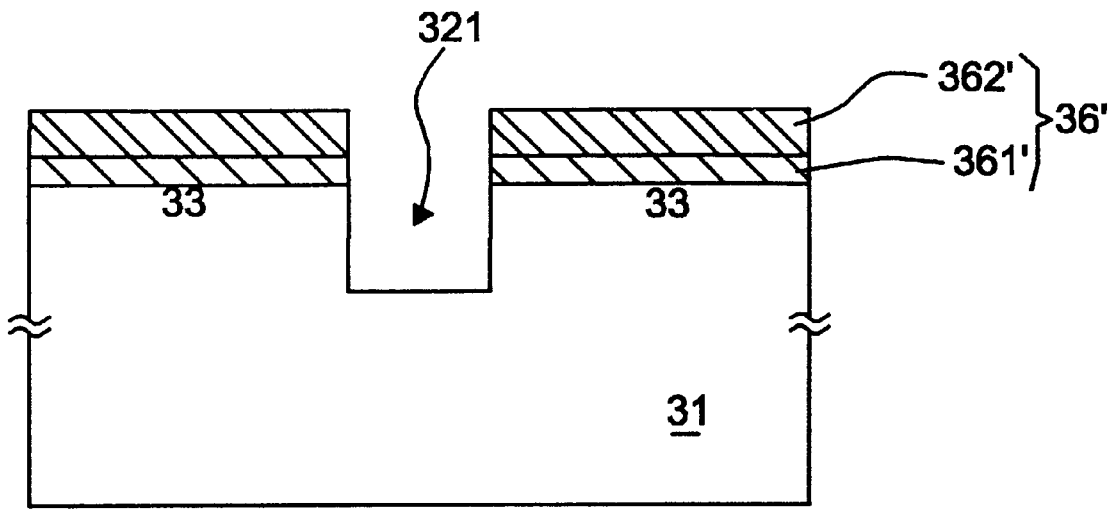

In FIG. 3C, a trench 321 is formed by etching the first portion 39 of the substrate 31. The trench 321 defines an active region 33 in a second portion of the substrate 31. An anisotropic etching is employed as an etching method of forming the trench 321. Then, the photoresist mask 37 is removed.

Figure 3D:
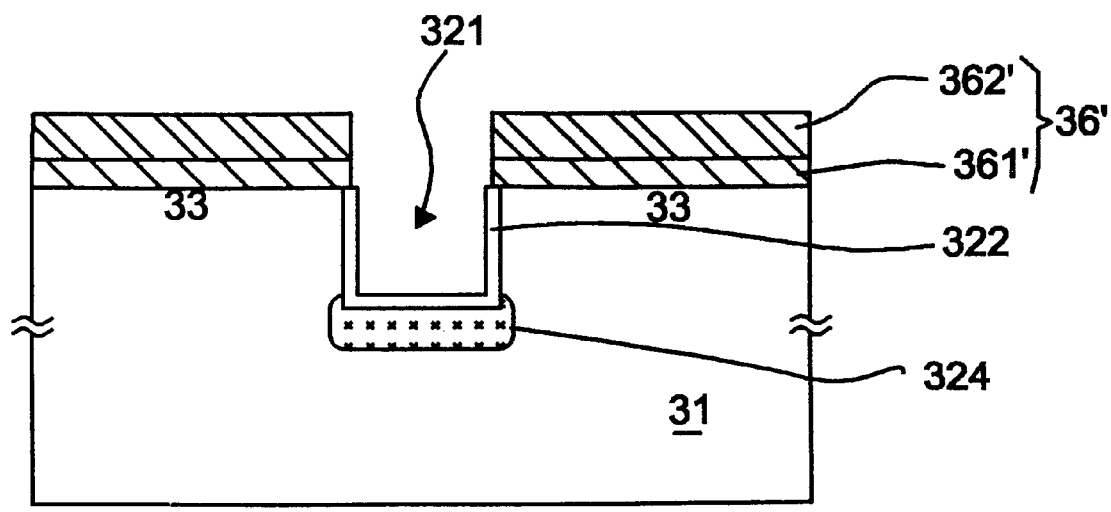

Referring to FIG. 3D, a trench liner 322 of an insulating material is formed on the inner surface of the trench 321, that is, on the side and bottom surfaces of the trench 321. The trench liner 322, which is formed to reduce damage caused by an etching process for forming the trench, is preferably a silicon oxide layer formed by thermal oxidation. The patterned etch-stop layer 36' serves as a mask for blocking oxidation other than for forming trench lines 322. Further, the trench liner 322 may also be formed from silicon oxynitride without a stress, which is an intermediate composition of silicon oxide having a high compressive force and silicon nitride having a tensile force. In the next step, channel stop ions are implanted into the bottom of the trench 321 of the substrate 31 so as to form a channel stop region 324. The channel stop region 324 may be formed prior to the formation of the trench liner 322.

Figure 3E:
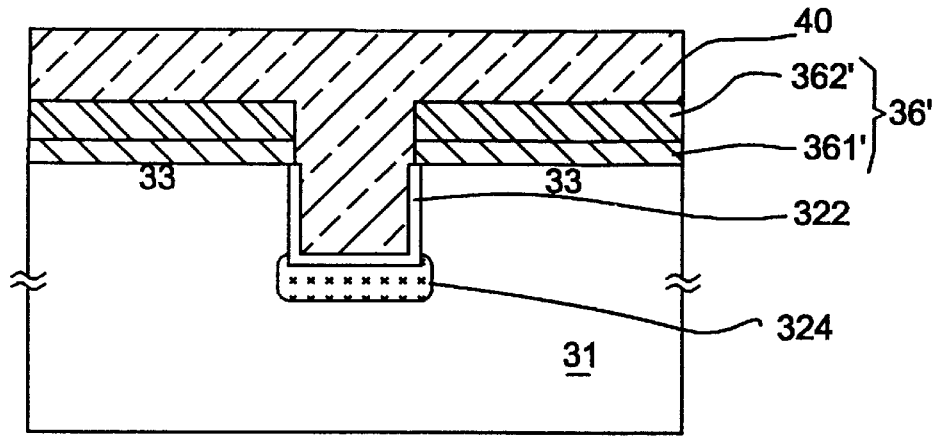

As shown in FIG. 3E, a trench-filling material layer 40 is formed so as to cover the trench liner 322 and the etch-stop layer 36'. The trench-filling material layer 40 is formed to fill the trench 321 substantially and completely. It is a silicon oxide layer formed with CVD, and can be obtained by the decomposition of TEOS (Tetra Ethyl Ortho Silicate).

Figure 3F:
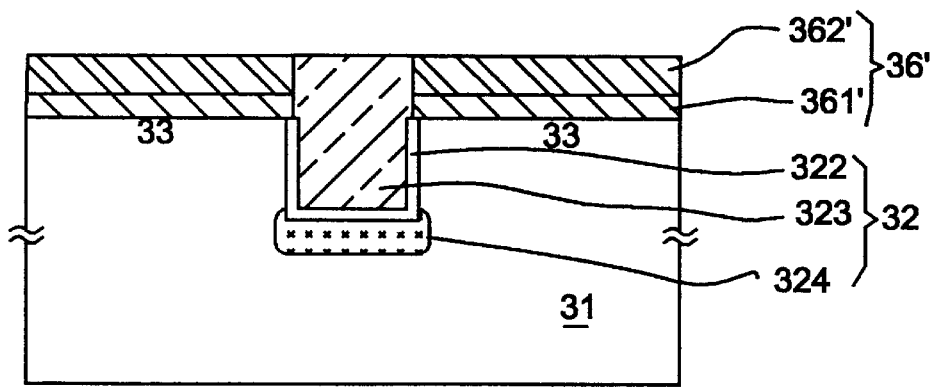

In FIG. 3F, a part of the trench-filling material layer 40 is selectively removed so as to form a trench plug 323 through CMP (Chemical Mechanical Polishing) or plasma etching. The trench-filling material layer 40 is selectively removed so as to expose the etch-stop layer 36' which serves as an etch-stopper. In this process, an isolation region 32 is formed, comprising a the trench 321, the trench liner 322, the trench plug 323 and the channel stop region 324. The isolation region 32 is formed adjacent to the active region 33 in the second portion of the substrate 31.

Figure 3G:
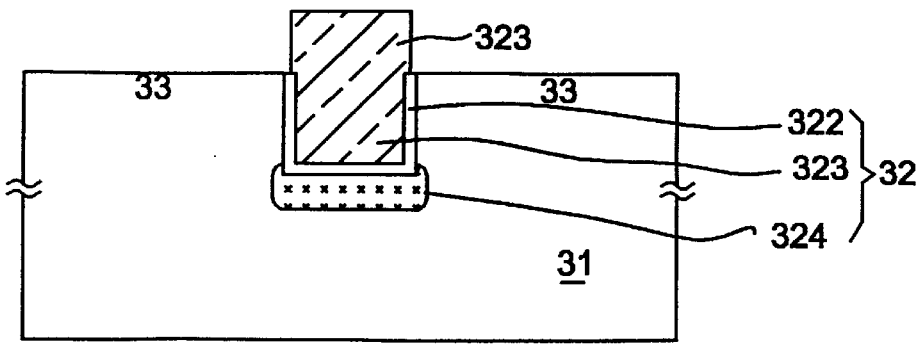

Successively, as shown in FIG. 3G, the etch-stop layer 36' is removed so as to expose the surface of the active region 33 of the substrate 31 and to make a part of the trench plug 323 project upwards from the surface of the substrate 31.

Figure 3H:
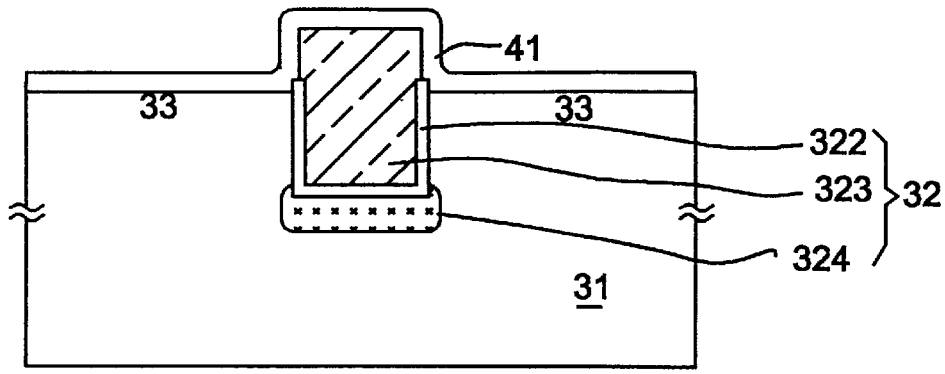

In FIG. 3H, an oxidative material layer 41 is formed to cover the surface of the substrate 31, including the trench plug 323. The oxidative material layer 41, which will become an insulating layer by oxidation, is formed CVD from polysilicon.

Figure 3I:
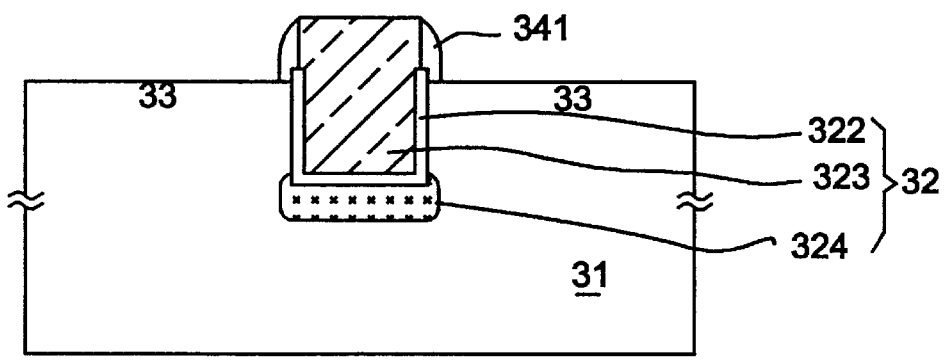

In FIG. 3I, a part of the oxidative material layer 41 is selectively removed through an etch-back process so as to form sidewall spacers 341 of an oxidative material on the side surfaces of the projecting portion of the trench plug 323.

Figure 3J:
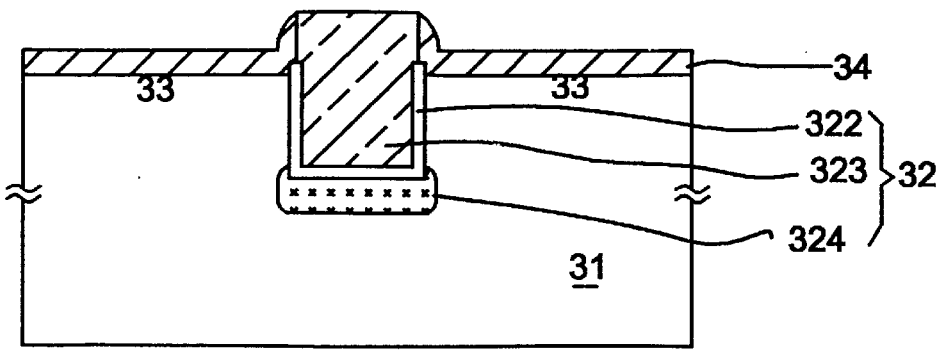

Finally, in FIG. 3J, a gate insulating layer 34 is formed by thermal oxidizing the surface of the active region 33 of the substrate 31 and the sidewall spacers 341. Thus, the gate insulating layer 34 extends to the surface of the active region 33 of the substrate 31 and the projected portion of the trench plug 323 on the major surface of the substrate 31. The structure leads to a perfect insulation of the corner of the trench 321. The uniformity and the reliability can be increased because the gate insulating layer 34 is formed with a single oxidation step.

Figure 4A:
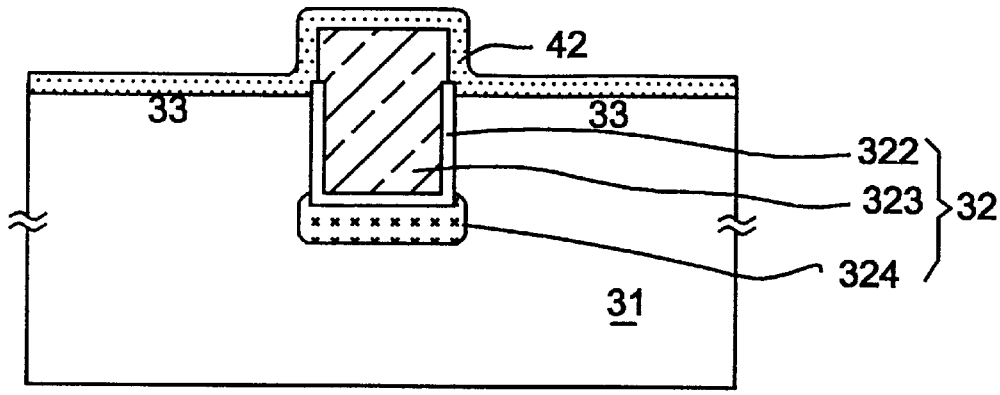
FIGS. 4A, 4B and 4C are flow diagrams illustrating a method of a semiconductor device according to another preferred embodiment of the present invention.
Figure 4B:
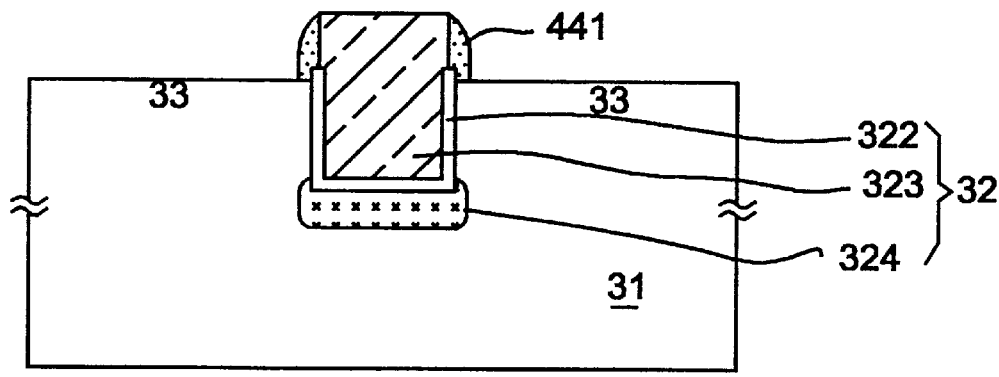
Figure 4C:
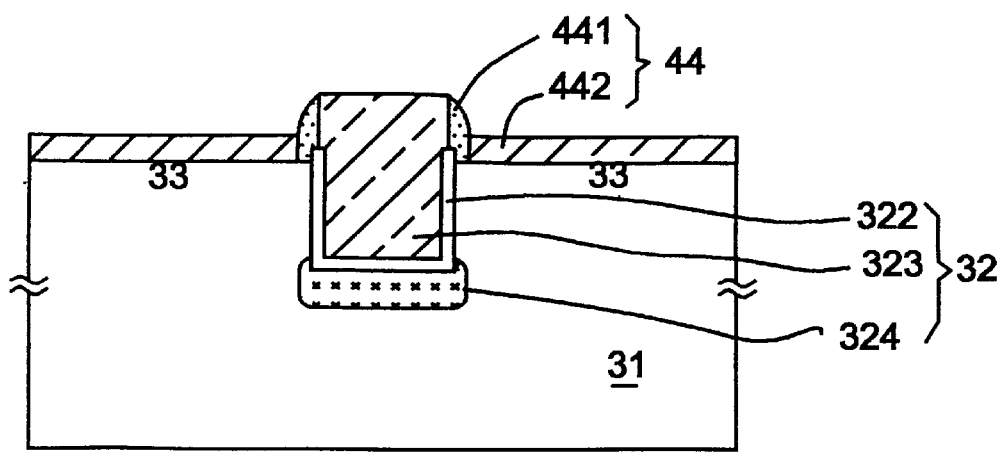

FIGS. 4A, 4B and 4C are flow diagrams illustrating a method of manufacturing a semiconductor device according to another preferred embodiment of the present invention.

As shown in FIG. 4A, an isolation region 32 comprising a trench 321, a trench liner 322, a trench plug 323 and a channel stop region 324 is formed on a substrate 31 so as to define an active region 33. Then, an insulating material layer 42 is formed so as to cover the major surface of the substrate 31 including the trench plug 323. The insulating material layer 42 is a silicon oxide layer deposited with CVD.

In FIG. 4B, a part of the insulating material layer 42 is selectively removed so as to form sidewall spacers 441 which are first insulating layers on the side surfaces of the projecting portion of the trench plug 323 on the major surface of the substrate 31. The sidewall spacer 441 is formed by etching back the insulating material layer 42, leaving a part of the insulating material layer 42 on the side surfaces of the projecting portion of the trench plug 323 on the major surface of the substrate 31. Accordingly, the sidewall spacers 441 cover the trench liner 322 as seen in FIG 4B, for example.

Referring to FIG. 4C, thermal oxidation of the surface of the active region 33 of the substrate leads to the formation of a second insulating layer 442 which will become a gate insulating layer 44 with the sidewall spacers 441 that are the first insulating layers. The corners of the trench 321 is perfectly insulated by the gate insulating layer 44 which comprises the first insulating layer, that is, the sidewall spacers 441, and the second insulating layer 442. The gate insulating layer 44 on the active region 33 is formed by thermal oxidation from a silicon oxide layer having the excellent uniformity and reliability.

It will be apparent to those skilled in the art that various modifications and variations can be made in a method of fabricating a semiconductor device having a trench isolation structure of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device having a trench isolation structure, comprising the steps of;

forming an etch-stop layer on a substrate;

selectively removing a part of the etch-stop layer so as to expose a portion of the substrate;

forming a trench at the exposed portion of the substrate;

forming a trench liner of an insulating material on an inner surface of the trench;

forming a trench-filling material layer covering the trench liner and the etch-stop layer;

selectively removing a part of the trench-filling material layer so as to expose the etch-stop layer and form a trench plug filling the trench;

removing the etch-stop layer so as to expose the substrate, leaving a part of the trench plug projecting upwards from a surface of the substrate;

forming a spacer on a sidewall of the projecting part of the trench plug from an oxidative material; and oxidizing the sidewall spacer and the surface of the substrate, thereby obtaining an insulating layer on the sidewall of the protecting part of the trench plug and on the surface of the substrate.

2. The method as claimed in claim 1, wherein forming the etch-stop layer comprises sequentially depositing a silicon oxide layer and a silicon nitride layer.

3. The method as claimed in claim 1, wherein forming the trench comprises anisotropically etching the exposed portion of the substrate.

4. The method as claimed in claim 1, wherein forming the trench liner comprises thermally oxidizing an inner surface of the trench.

5. The method as claimed in claim 1, wherein forming the trench-filling material layer comprises depositing a silicon oxide layer.

6. The method as claimed in claim 1, wherein selectively removing a part of the trench-filling material layer the trench plug comprises polishing the trench-filling material layer.

7. The method as claimed in claim 1, wherein selectively removing a part of the trench-filling material layer the trench plug comprises plasma-etching the trench-filling material layer.

8. The method as claimed in claim 1, further comprising a step of implanting channel stop ions into a bottom surface of the trench.

9. The method of claim 1, wherein forming a spacer comprises:

covering the substrate and the projecting part of the trench plug with an oxidative material layer; and removing part of the oxidative material layer so as to leave a sidewall spacer remaining on the sidewall of the projecting part of the trench plug.

10. The method as claimed in claim 9, wherein the oxidative material layer is a polysilicon.

11. The method of claim 9, wherein the oxidative material is an oxide.

12. A method of fabricating a semiconductor device having a trench isolation structure, comprising the steps of:

forming an etch-stop layer on a substrate;

selectively removing a part of the etch-stop layer to expose a part of the substrate;

forming a trench at the exposed part of the substrate using the etch-stop layer as a mask;

forming a trench liner from a first insulating material on an inner surface of said trench;

forming a trench plug from a second insulating material in the trench over the trench liner and a side surface of the etch-stop layer;

removing the etch-stop layer to expose a projecting part of the trench plug and the substrate;

forming a spacer on a sidewall of the projecting part of the trench plug from an oxidative material; and oxidizing the sidewall spacer and the surface of the substrate, thereby obtaining a third insulating layer on the sidewall of the projecting part of the trench plug and on the surface of the substrate.

13. The method of claim 12, wherein forming the etch-stop layer comprises forming an oxide layer and a nitride layer on the substrate.

14. The method of claim 12, wherein forming the trench comprises anisotropically etching the exposed part of the substrate.

15. The method of claim 12, wherein forming the trench liner comprises thermally oxidizing an inner surface of the trench.

16. The method of claim 12, wherein the first insulating material is an oxide and the second insulating material is a TEOS.

17. The method as claimed in claim 12, wherein the oxidative material is a polysilicon.

* * * * *